United States Patent [19]
Naud et al.

[11] Patent Number: 5,971,254
[45] Date of Patent: Oct. 26, 1999

[54] DECOUPLED XYZ STAGE

[75] Inventors: Royce E. Naud; Larry D. Giaudrone, both of Dallas, Tex.

[73] Assignee: Texas Instruments Incorporated, Dallas, Tex.

[21] Appl. No.: 09/000,683

[22] Filed: Dec. 30, 1997

Related U.S. Application Data

[60] Provisional application No. 60/035,732, Jan. 2, 1997.

[51] Int. Cl.$^6$ .......................... H01L 21/60; G05G 11/00
[52] U.S. Cl. ...................... 228/180.5; 228/4.5; 74/490.09
[58] Field of Search .................................. 228/4.5, 180.5; 74/490.09; 108/143

[56] References Cited

U.S. PATENT DOCUMENTS

| | | | |
|---|---|---|---|
| 5,157,985 | 10/1992 | Yamazaki et al. | 108/143 |
| 5,653,375 | 8/1997 | Nam | 228/4.5 |
| 5,735,449 | 4/1998 | Magni | 228/180.5 |

FOREIGN PATENT DOCUMENTS

| | | | |
|---|---|---|---|
| 55-138853 | 10/1980 | Japan | 228/4.5 |

*Primary Examiner*—Patrick Ryan
*Assistant Examiner*—Jeffrey T. Knapp
*Attorney, Agent, or Firm*—W. James Brady, III; Richard L. Donaldson

[57] ABSTRACT

The invention includes an XYZ stage 100 for positioning an object 140 in an X direction, a Y direction orthogonal to said X direction, and a Z direction orthogonal to both said X and Y directions. The stage 100 comprises a generally horizontal movable stage 104, a stationary X motor connected to said movable stage 104 for moving said stage in an X direction, a stationary Y motor 106 movably connected to said movable stage 104 for moving the stage 102 in a Y direction independently of the X direction, wherein the stage 100 has an L shaped bell crank 132 having an outside corner pivotally mounted on the stage 104 so that the bell crank 132 is rotatable in a vertical plane through the stage about an axis in the X direction, and a stationary Z axis motor connected to one end of the bell crank for movement of this one end in a Y direction. The other end of the bell crank thus moves in a Z direction.

20 Claims, 1 Drawing Sheet

DECOUPLED XYZ STAGE

This application claims priority under 35 USC § 119(e)(1) of provisional application No. 60/035,732 filed Jan. 2, 1997.

BACKGROUND OF THE INVENTION

1. Field of the Invention

This invention generally relates to automated mechanical positioning devices and more particularly to a positioning apparatus in three dimensions.

2. Description of the Related Art

Conventional three dimensional positioning devices typically have an X axis stage which is movably mounted on a fixed base surface with its servomotor fastened to the base surface, driving a screw and nut on the screw which is in turn fixed to the X axis stage. As the screw rotates, the nut moves in the X direction and carries with it the X axis stage. The Y-axis stage motor may also be fixedly mounted on the base surface, i.e. decoupled from the X stage. In this case the Y stage may be directly above the X axis stage and may be mounted on two rollers on either side of an elongated bar or "Y direction bar" aligned along the X axis. The Y axis motor is mounted on the base and drives a screw with a nut connected to the "Y" direction bar. The Z axis servo motor is typically mounted on the Y stage and operates a bell crank to move a component being positioned, such as a probe, up and down along a Z axis.

Alternatively, as shown in FIG. 1, the XYZ stage 10 for positioning a bond tool 12 in three dimensions has an X axis motor 14 fixed to a base 16. Slidably mounted on base 16 is an X stage 18 which is moved back and forth on the base 16 in the X direction 19 by the X axis motor 14 through a nut on a screw (not shown). The Y axis motor 20 is fastened to the X stage 18 and drives a Y axis stage back and forth along the Y direction 24 over the X stage. The Z axis drive motor 26 is mounted on the Y stage 22 and operates through a linkage 28 to raise and lower the bonder 12 in the Z direction 30, thus providing XYZ positioning of the bonder 12 with respect to the base 16.

A major problem with the above designs is that both the X and Y stage motors have a tremendous inertial mass to overcome during movement. The X axis motor 14 must move the entire assembly including the Y and Z motors and X, Y, and Z stage components. The Y motor must move the Z motor in addition to the Y stage. This is not a problem in many applications. However, transit time becomes a significant problem when indexing must be done quickly and frequently. The response time of a computer controlled stage such as the ones above described is largely limited by this inertial mass problem. The positioning of a bonder in semiconductor manufacturing today is fast becoming a major contributor to the overall processing time. Reducing processing time would mean higher throughputs and increased productivity which translates to lower cost. Consequently there is a need for a XYZ stage design which minimizes inertial mass dependent movements and a design in which the bonder or other component being positioned can be more rapidly positioned than is currently available with conventional machines.

SUMMARY OF THE INVENTION

It is therefore an object of the present invention to provide an XYZ stage that addresses the above identified needs.

It is another object of the invention to provide an XYZ stage that reduces the inertial mass being moved in any direction.

It is another object of the invention to provide an XYZ positioning apparatus in which the Z motor is mounted on the Y axis motor in order to decouple the Z motor from the Y and X axis stages.

These and other objects features and advantages of the present invention will become more apparent from a reading of the following detailed description when taken in conjunction with the accompanying drawing.

The present invention is a mechanical stage for positioning a body in three dimensions which comprises a first positioning mechanism mounted on a surface and coupled to a body to be positioned on the surface adapted to move the body in a first or X direction over the surface. A second positioning mechanism is removably coupled to the body for movement of the body in a second or Y direction over the surface, i.e. orthogonal to the first or X direction. A third translation mechanism is mounted either to the surface or on one of the first or second mechanisms. This third mechanism is removably coupled to the body for movement of the body in a third or Z direction substantially normal to a plane formed between the first and second directions, i.e. normal to the X-Y plane.

More particularly, the invention includes an XYZ stage for positioning an object in an X direction, a Y direction orthogonal to said X direction, and a Z direction orthogonal to both said X and Y directions. The stage comprises a generally horizontal movable stage, a stationary X motor connected to said movable stage for moving said stage in an X direction, a stationary Y motor movably connected to said movable stage for moving the stage in a Y direction independently of the X direction, wherein the stage has an L shaped bell crank having an outside corner pivotally mounted on the stage so that the bell crank is rotatable in a vertical plane through the stage about an axis in the X direction, and a stationary Z axis motor connected to one end of the bell crank for movement of this one end in a Y direction. The other end of the bell crank thus moves in a Z direction.

DETAILED DESCRIPTION OF THE PREFERRED EMBODIMENT

Figure 1:
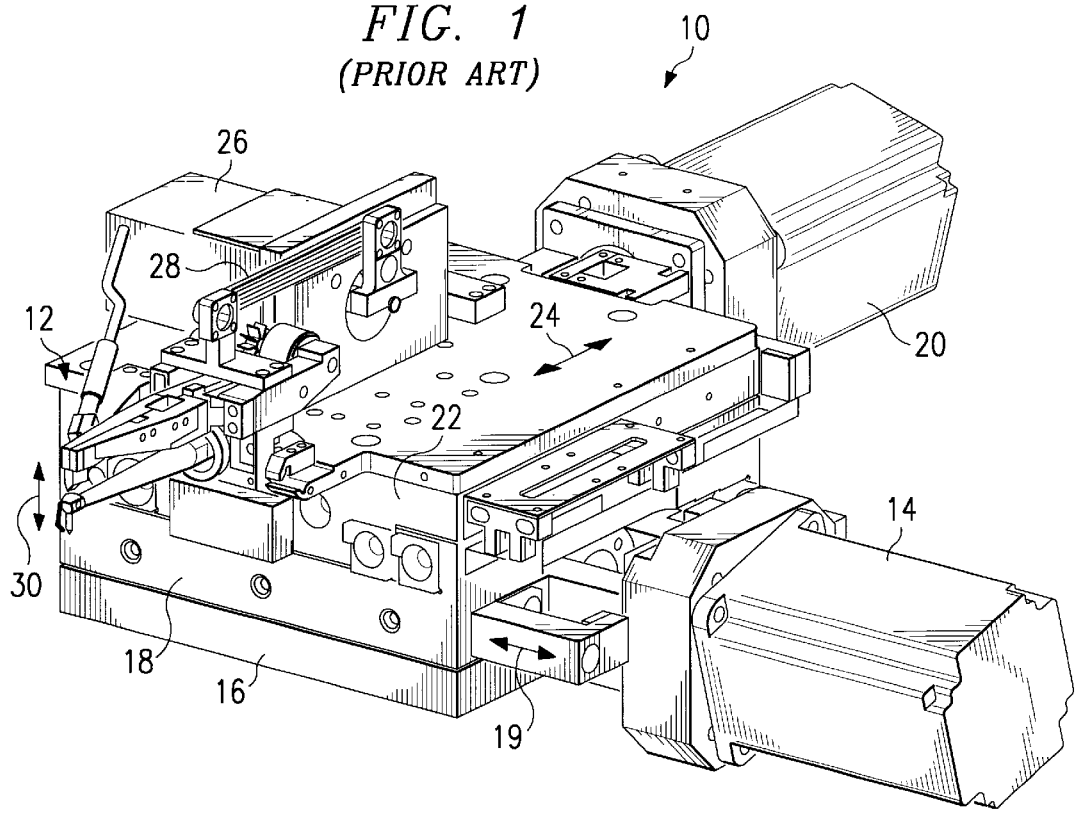
FIG. 1 is a perspective view of a conventional XYZ stage for positioning a wire bonder according to the prior art.
Figure 2:
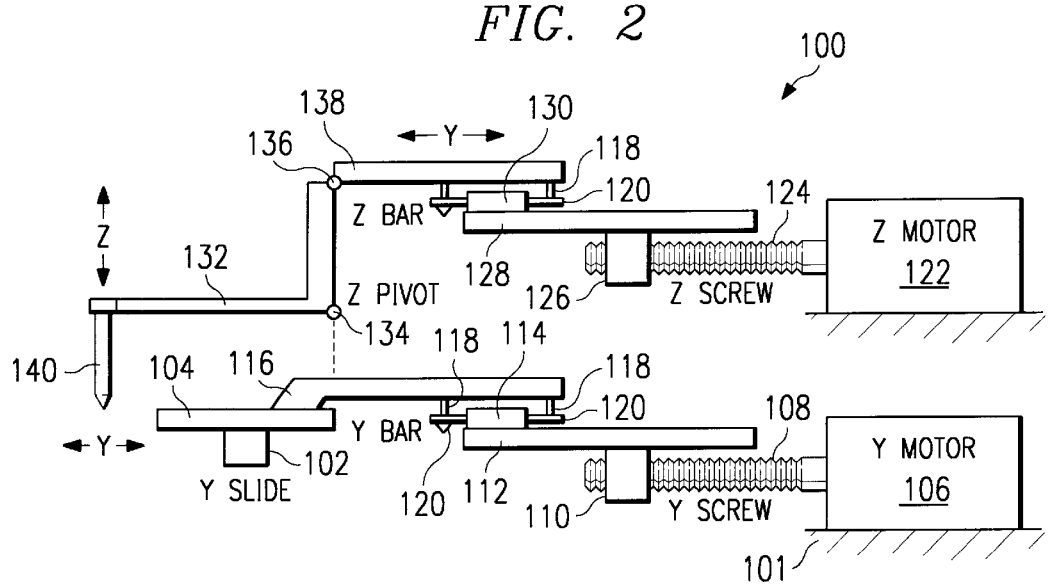
FIG. 2 is a schematic elevational side view of an XYZ stage in accordance with the invention.

Referring now to FIG. 2, a side elevational schematic representation of the XYZ stage 100 in accordance with the present invention is shown utilized in a wire bonder. The XYZ stage 100 comprises an X axis motor fixed to a base. The axis motor moves an X axis nut 102 along an X direction into and out of the paper in FIG. 2. The X axis nut 102 is fastened to the Y axis slide 104, which therefore also moves into and out of the paper in FIG. 2.

A Y axis motor 106 is fixedly mounted to the base 101 and drives a screw 108 oriented in a direction normal to movement of the X axis nut 102, and moves a Y axis nut 110 on the screw 108 back and forth from left and right and vice versa in FIG. 2 as the Y motor rotates the screw 108. Attached to the top of the nut 110 is a slide plate 112 which has an elongated ground "Y" bar 114 fixed to its upper surface. The Y bar 114 is oriented with its long dimension aligned in an X direction, i.e. with its length extending into and out of the paper in FIG. 2. As the Y motor moves the nut and slide 112 left and right as viewed in FIG. 2, the Y bar also moves left and right.

A fixed guide arm member 116 extending toward the Y axis motor 106 from the Y axis slide 104 carries a pair of spaced, downwardly extending shafts 118 each carrying a roller 120. These rollers 120 ride along the sides of the Y bar 114. As the Y motor rotates, the nut 110, the slide 112 and in turn, the Y bar 114 moves right and left, pushing the Y stage right and left via the rollers 120. As the X axis motor rotates, the Y stage moves in and out of the paper in FIG. 2 with the rollers 120 rolling along the Y bar 114. Thus the Y stage is translated in X and Y directions.

The Z axis motor 122 is mounted to the base 101 preferably directly above the Y axis motor 106. Alternatively the Z axis motor may be mounted directly to the Y axis motor 106. The Z axis motor 122 is oriented the same as the Y axis motor. It has a lead screw 124 aligned parallel to and preferably directly above the Y motor lead screw 108. A nut 126 rides on this lead screw 124 and carries a slide 128 similar to the slide 112. The slide 128 in turn has an elongated "Z" bar 130 fixed to its upper surface, which is aligned parallel to the Y bar 114. An "L" shaped bell crank 132 has its outer corner 134 hinged to the upper surface of the guide arm member 116. The bell crank 132 therefore moves in the X direction along with the Y stage 104. The upper end 136 of the short end of the bell crank 132 is hinged to a guide arm member 138 extending toward the Z axis motor 122 over the Z bar 130. The hinged guide arm 138 carries a pair of spaced, downwardly extending shafts 118 each carrying a roller 120. These rollers 120 ride along the sides of the Z bar 130.

In order to maintain the same Z height during Y axis translation, as the Y motor rotates, the Z motor must rotate such that the nut 126 moves the slide 128 the same distance as the Y axis slide 112, so that the same angle is maintained on the bell crank 132. When the X and Y axis positions are fixed, the Z axis position may be varied independently by movement of the Z axis motor alone, but only through an extremely small distance. For larger movements in the Z axis direction, the Z axis motor and the Y axis motor 106 must move in concert with each other. The maximum the Z axis movement is limited by the tolerance of the guide arm 138, as this arm is generally retained in a horizontal position, to between about 1–3 centimeters, depending on the length of the long leg of the bell crank 132 to which the end component such as a wire bonder tool element 140 is attached.

In this design, to accomplish Y axis translations, the Z motor and the Y motor must operate together. To accomplish Z axis movements the Z motor and Y motor must operate in proportion to the movement. For example, if the Z movement is only a millimeter, no movement of the Y axis motor may be needed. However, if the Z axis movement is to be 1–3 centimeters, substantial Y motor operation may be required to maintain the Y position within tolerance as the Z position is changed. For X axis translation, only operation of the X axis motor is required.

Each of the movements described above moves only a small mass. The motors remain stationary, and only the Y stage and bell crank are moved. This arrangement reduces the mass which must be moved permitting reduced inertial settling times during translations and therefore reduced acceleration and deceleration times which results in faster position changes and improved throughput in systems requiring a number of independent movements, such as in the wire bonder 140.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A wire bonding apparatus having an XYZ stage for positioning a bonder element in an X direction, a Y direction orthogonal to said X direction, and a Z direction orthogonal to both said X and Y directions, said stage comprising:

a generally horizontal movable stage;

a stationary X motor connected to said movable stage for moving said stage in an X direction;

a stationary Y motor movably connected to said movable stage for moving said stage in a Y direction independently of said X direction;

an L shaped bell crank having an outside corner pivotally mounted on said stage so that said bell crank is rotatable in a vertical plane through said stage about an axis in said X direction; and a stationary Z axis motor connected to one end of said bell crank for movement of said one end in a Y direction and another end of said bell crank in a Z direction, said other end of said bell crank supporting a wire bonder element for movement of said element in three dimensions.

2. A method for positioning a wire bonder element in three dimensions comprising the steps of:

providing a first positioning mechanism mounted on a surface and coupled to a wire bonder element to be positioned over said surface, said first mechanism;

moving said element in a first direction over said surface;

providing a second positioning mechanism removably coupled to said element;

moving said element in a second direction over said surface normal to said first direction;

providing a third translation mechanism mounted on one of said first or second mechanisms and removably coupled to said element; and moving said element in a third direction substantially normal to a plane formed between said first and second directions.

3. The method according to claim 2 wherein said step of moving said element in said third direction further comprises the step of pivoting a bell crank member about an axis in said plane.

4. The method according to claim 3 wherein said step of moving said element in said second direction includes the step of moving said bell crank member in said second direction.

5. A mechanical stage for positioning a body in three dimensions comprising:

a first positioning mechanism mounted on a surface and coupled to a body to be positioned over said surface, said first mechanism adapted to move said body in a first direction over said surface;

a second positioning mechanism removably coupled to said body for movement of said body in a second direction over said surface normal to said first direction; and a third translation mechanism mounted on one of said first or second mechanisms and removably coupled to said body for movement of said body in a third direction substantially normal to a plane formed between said first and second directions.

6. The stage according to claim 5 wherein said third translation mechanism comprises an "L"shaped bell crank having a long leg connected to said body and a short leg connected to a Z motor.

7. The stage according to claim 6 wherein said bell crank is pivotally connected to a stage platform coupled to both said first and second translation mechanisms.

8. The stage according to claim 7 wherein each of said first and second translation mechanisms comprises a stationary motor connected to said platform.

9. The stage according to claim 8 wherein said Z motor is mounted on one of said stationary motors.

10. An XYZ stage for positioning an object in an X direction, a Y direction orthogonal to said X direction, and a Z direction orthogonal to both said X and Y directions, said stage comprising:

a generally horizontal movable stage;

a stationary X motor connected to said movable stage for moving said stage in an X direction;

a stationary Y motor movably connected to said movable stage for moving said stage in a Y direction independently of said X direction, wherein said;

an L shaped bell crank having an outside corner pivotally mounted on said stage so that said bell crank is rotatable in a vertical plane through said stage about an axis in said X direction; and a stationary Z axis motor connected to one end of said bell crank for movement of said one end in a Y direction and another end of said bell crank in a Z direction.

11. The stage according to claim 10 wherein said Z axis motor is mounted directly above said Y axis motor.

12. The stage according to claim 11 wherein said Z axis motor is mounted directly to said Y axis motor.

13. The stage according to claim 12 wherein said one end of said bell crank is hinged to a guide arm connected to said Z axis motor.

14. The stage according to claim 10 wherein said one end of said bell crank is on a short leg of said bell crank.

15. The stage according to claim 14 wherein said other end of said bell crank is on a long leg.

16. The stage according to claim 15 wherein said other end of said long leg is connected to a wire bonder tool element.

17. The stage according to claim 16 wherein said one end of said short leg is pivotally connected to said Z axis motor.

18. The stage according to claim 17 further comprising a guide arm connected between said Z axis motor and said one end of said bell crank.

19. The stage according to claim 18 wherein said Z axis motor is mounted directly above said Y axis motor.

20. The stage according to claim 19 wherein said Z axis motor is mounted directly to said Y axis motor.

* * * * *